United States Patent
Saito et al.

[11] Patent Number: 5,972,730
[45] Date of Patent: Oct. 26, 1999

[54] NITRIDE BASED COMPOUND SEMICONDUCTOR LIGHT EMITTING DEVICE AND METHOD FOR PRODUCING THE SAME

[75] Inventors: Shinji Saito, Yokohama; John Rennie, Bunkyo-ku; Masaaki Onomura, Kawasaki; Genichi Hatakoshi, Yokohama, all of Japan

[73] Assignee: Kabushiki Kaisha Toshiba, Kawasaki, Japan

[21] Appl. No.: 08/937,160

[22] Filed: Sep. 25, 1997

[30] Foreign Application Priority Data

Sep. 26, 1996 [JP] Japan .................................. 8-254960

[51] Int. Cl.$^6$ ..................... H01L 21/00; H01L 21/301; H01L 21/46; H01L 21/78
[52] U.S. Cl. ...................... 438/39; 438/460; 372/45; 372/50
[58] Field of Search ................... 438/39, 40, 41, 438/31, 460; 372/45, 50

[56] References Cited

U.S. PATENT DOCUMENTS

| | | | |
|---|---|---|---|
| 5,012,477 | 4/1991 | Mesquida et al. | 372/50 |
| 5,604,763 | 2/1997 | Kato et al. | 372/45 |
| 5,753,966 | 5/1998 | Morita et al. | 257/627 |
| 5,777,350 | 7/1998 | Nakamura et al. | 257/96 |
| 5,804,839 | 9/1998 | Hanaoka et al. | 257/123 |

FOREIGN PATENT DOCUMENTS 7-297496  11/1995  Japan .

OTHER PUBLICATIONS

B. Groussin, et al., Laser Diode Technology and Application V, SPIE vol. 1850, p. 330, "1000W QCW Output Power from Surface Emitting GaAs/AlGaAs Laser Diodes Arrays", 1993.

*Primary Examiner*—Brian Dutton
*Attorney, Agent, or Firm*—Oblon, Spivak, McClelland, Maier & Neustadt, P.C.

[57] ABSTRACT

A wedge-like etching groove is formed so that stresses can be collected along a cleavage surface of a nitride based compound semiconductor, and end portions are separated from a substrate. With these operations, a light-emitting layer can form an excellent mirror by a natural cleavage. Further, by separating a portion of the end surfaces from the substrate, it is possible to suppress a deformation from the substrate and therefore, a deterioration due to the deformation can be prevented. Therefore, it is possible to provide a nitride based compound semiconductor light-emitting device which can form an excellent cleavage surface with a simple process.

12 Claims, 16 Drawing Sheets

NITRIDE BASED COMPOUND SEMICONDUCTOR LIGHT EMITTING DEVICE AND METHOD FOR PRODUCING THE SAME

BACKGROUND OF THE INVENTION

1. Field of the Invention

The present invention relates to a semiconductor light-emitting device using a nitride based compound semiconductor material, and more particularly, to a nitride based compound semiconductor light-emitting device comprising a nitride based compound semiconductor such as GaN, AlGaN and InGaN, and a method for producing the same.

2. Description of the Related Art

In recent years, a semiconductor laser is used in various fields such as home electric products, office automation equipments, communication equipments and industrial measuring instruments. Among them, it is desired to develop a semiconductor laser of short wavelength on purpose to apply it to a high density laser disk recording system which is expected to be used in various field. At the present, a red light-emitting semiconductor laser is used, and its recording density is enhanced as compared with that of a conventional infrared semiconductor laser. However, it is difficult to apply the red light-emitting semiconductor laser to a laser disk recording of the next generation, since there exist a large number of problems concerning the nature of the materials such as crystal defects and the high operating voltage. Further, the oscillation wavelength is about 460 nm at the shortest and thus, it is difficult, in view of physical properties, to let the laser oscillate in a range between 420 nm and 430 nm.

As to nitride based compound semiconductor laser including GaN, it is possible, in principle, to shorten a wavelength down to 350 nm or less, oscillating operation at 400 nm has been reported. Concerning reliability also, it has been confirmed that the nitride based compound semiconductor device was reliably used for more than 10,000 hours as a light-emitting diode(LED). As described above, the nitride semiconductor system is a material having excellent properties that can meet necessary conditions as a laser disk recording laser source of the next generation.

A resonator is required for laser oscillating operation. A usual semiconductor laser has a pair of mirrors consisting of a natural cleavage surface to form the resonator. This utilizes a fact that there exists a plane of smaller bonding energy in a direction of [011] or [0-11] in zincblende(sphalerite) structure of cubic system type, i.e., a cleavage plane. In the nitride semiconductor system, there exist cubic system type and hexagonal system type. At the present, the hexagonal system type crystal grown on a sapphire substrate is the best crystal. However, because the hexagonal system type does not have clear mode of a natural cleavage, the nitride semiconductor crystals are induced to the cleavage plane of the sapphire substrate and broken in such a direction, thus, it is difficult to form the resonant mirrors, causing a problem that the yield of device production process is low.

Further, there is a problem that the resonant mirrors are suddenly deteriorated at the time of operation with high optical output, and problems have been pointed out that a deformation is generated between the resonant mirrors and a substrate due to a heat generated at the time of operation and thus dislocations are increased to deteriorate the mirror surfaces.

Furthermore, when the laser is used as a optical source of the laser recording disk, it is necessary to control a lateral mode and oscillate the laser only by a fundamental mode in order to focus the beam spot thereof. However, controlling the lateral mode in the laser of high output is difficult, especially in the case of the high power lasers for the data writing in the laser disc system.

As described above, in the conventional nitride based semiconductor light-emitting device, there are various problems that it is very difficult to form the resonant mirrors, its reliability is low and the lateral mode control is difficult.

SUMMARY OF THE INVENTION

The present invention has been accomplished in view of the above described problems. Namely, an object of the present invention is to provide a nitride based compound semiconductor light-emitting device and a method for producing the same in which a cleaved mirror surface having excellent quality can be formed with a simple process.

According to a first aspect of the present invention, there is provided a nitride based compound semiconductor light-emitting device, comprising at least: a substrate; an intermediate layer; a first cladding layer comprising a nitride based compound semiconductor; an active layer comprising a nitride based compound semiconductor; and a second cladding layer comprising a nitride based compound semiconductor; wherein at a side surface of the light-emitting device at its light ejecting side, a side surface of the intermediate layer is retreated inward of the device with respect to a side surface of the active layer, and a recess is formed between the substrate and the side surface of the active layer.

It is preferable that the intermediate layer comprises a material selected from a group including AlN, AlGaN, InAlGaN, ZnO and InGaN.

It is preferable that the substrate comprises any one of sapphire and SiC.

According to a second aspect of the invention, there is provided a nitride based compound semiconductor light-emitting device, comprising at least: a substrate; a first contact layer; an electric current-confinement layer; an active layer comprising a compound including nitrogen; a second contact layer; a first electrode formed such as to contact with the first contact layer; and a second electrode formed such as to contact with the second contact layer; wherein a side surface of the electric current-confinement layer is retreated inward with respect to a side surface of the active layer, and a recess is formed between the substrate and the side surface of the active layer.

It is preferable that the electric current-confinement layer comprises a material selected from a group including AlN, AlGaN, InAlGaN, ZnO and InGaN.

It is preferable that the substrate comprises sapphire.

According to a third aspect of the invention, there is provided a nitride based compound semiconductor light-emitting device, comprising at least: a substrate; an intermediate layer; a first cladding layer comprising a nitride based compound semiconductor; an active layer comprising a nitride based compound semiconductor; and a second cladding layer comprising a nitride based compound semiconductor; wherein the nitride based compound semiconductor light-emitting device emits a laser beam by a resonant using, as a light reflecting surface, portions of opposite side surfaces of the active layer; at a side surface of the light-emitting device at its light ejecting side, a side surface of the intermediate layer is retreated inward of the device with respect to a side surface of the active layer, and a recess is formed between the substrate and the side surface of the active layer; at a side surface of the light-emitting device at its light ejecting side, there are provided; a cleavage surface of the nitride based compound semiconductor light-emitting device including a portion which ejects the strongest the laser beam; and a low reflective surface which is disposed at opposite sides of the cleavage surface, and which has a smaller reflectance of a wavelength of the laser beam than that of the cleavage surface.

It is preferable that the intermediate layer comprises a material selected from a group including AlN, AlGaN, InAlGaN, ZnO and InGaN.

It is preferable that the substrate comprises any one of sapphire and SiC.

It is preferable that the low reflective surface is inclined with respect to the cleavage surface.

It is preferable that the intermediate layer comprises a material selected from a group including AlN, AlGaN, InAlGaN, ZnO and InGaN.

It is preferable that the substrate comprises any one of sapphire and SiC.

According to a fourth aspect of the invention, there is provided a nitride based compound semiconductor light-emitting device, comprising at least: a substrate; an electric current-confinement layer; a first cladding layer comprising a nitride based compound semiconductor; an active layer comprising a nitride based compound semiconductor; and a second cladding layer comprising a nitride based compound semiconductor; a contact layer; a first electrode formed such as to contact with the contact layer; and a second electrode formed such as to contact with the substrate; wherein at a side surface of the light-emitting device at its light ejecting side, a side surface of the electric current-confinement layer is retreated inward of the device with respect to a side surface of the active layer, and a recess is formed between the substrate and the side surface of the active layer.

It is preferable that the electric current contraction layer comprises a material selected from a group including AlN, AlGaN, InAlGaN, ZnO and InGaN.

It is preferable that the substrate comprises SiC.

It is preferable that the first cladding layer comprises AlGaN, the active layer comprises InGaN, and the second cladding layer comprises AlGaN.

According to a fifth aspect of the invention, there is provided a method for producing a nitride based compound semiconductor light-emitting device; comprising the steps of: forming a first contact layer on a substrate; forming, in a laminating manner, an electric current-confinement layer, on the first contact layer; forming, in a laminating manner, an active layer comprising a compound including nitrogen, on the electric current-confinement layer; forming, in a laminating manner, a second contact layer, on the active layer; forming a first electrode which is in contact with the first contact layer; forming a second electrode which in contact with the second contact layer; etching a laminate from the first contact layer to the second contact layer using a mask to form a mesa-type laminate; separating devices one by one by dicing from the substrate on which the mesa-type laminate is formed; placing the separated devices on a base, then dipping the device into an etching liquid to selectively etch the electric current-confinement layer from its side surface area, and forming a recess in a side surface of the mesa-type laminate; and applying an external force to the laminate on which the recess is formed for cleaving.

According to a sixth aspect of the invention, there is provided a method for producing a nitride based compound semiconductor light-emitting device; comprising the steps of: laminating an intermediate layer on a substrate; laminating, on the intermediate layer, a first cladding layer comprising a nitride based compound semiconductor, an active layer comprising a nitride based compound semiconductor, and a second cladding layer comprising a nitride based compound semiconductor; forming an etching mask on the second cladding layer; conducting a first etching step for etching the substrate in a vertical direction through the etching mask until a side surface of the intermediate layer is exposed; conducting a second etching step for selectively etching the side surface of the intermediate layer which is exposed by the first etching step, thereby forming a recess; and removing, by cleavage, a semiconductor layer portion including the active layer projecting on the recess so as to form an end surface of a semiconductor laser.

It is preferable that the etching mask includes at least one wedge-like shape for collecting stresses along a cleavage surface of the nitride based compound semiconductor so that the nitride based compound semiconductor which constitutes the active layer is easily cleaved.

According to a seventh aspect of the invention, there is provided a method for producing a nitride based compound semiconductor light-emitting device; comprising the steps of: laminating an electric current-confinement layer on a main surface of a substrate; laminating a first cladding layer comprising a nitride based compound semiconductor, on the electric current-confinement layer; laminating an active layer comprising a nitride based compound semiconductor, on the first cladding layer; laminating a second cladding layer comprising a nitride based compound semiconductor, on the active layer; forming a first electrode on the laminated structure; forming a second electrode on a back surface of the substrate; separating the laminated structure formed on the substrate together with the substrate one device by one device to form a mesa-type laminate; and selectively etching the electric current-confinement layer which is exposed to a side surface of the mesa-type laminate to form a recess in the side surface.

It is preferable that the electric current-confinement comprises a material selected from a group including AlN, AlGaN, InAlGaN, ZnO and InGaN.

It is preferable that the substrate comprises SiC.

According to the present invention, it is possible to provide a semiconductor laser apparatus with the excellent cavity mirrors, whose electric current injection density and the light-emitting efficiency are markedly high, and whose device structure is fairly simplified.

Further, according to the present invention, because a deformation of the light-emitting layer is moderated, the reliability is improved. Because the electric current flowing through the end surfaces is suppressed, optical sudden deterioration is not easily generated at the end mirror surfaces, and it is possible to obtain a device having a high output power and an excellent reliability.

Furthermore, the above described structure can be produced by a simple process which can easily be repeated and is extremely useful.

BRIEF DESCRIPTION OF THE DRAWINGS

FIGS. 15a and 15b show explanatory diagrams showing a shape of semiconductor layers after an etching process, wherein FIG. 15a is a schematic perspective view of the semiconductor layers, and FIG. 15b is a schematic front view taken along the arrow shown in FIG. 15a;

DETAILED DESCRIPTION OF THE PREFERRED EMBODIMENTS

According to the present invention, light-emitting layers can form excellent mirrors by a natural cleavage without causing a phenomenon that the cleavage may be induced by a substrate. Further, the portion of the mirror surfaces are separated from the substrate so that a deformation is not easily transferred from the substrate, thereby making it possible to prevent a deterioration due to the deformation. Furthermore, according to the present invention, the lateral mode is controlled to provide an excellent light-emitting device as a laser source for the optical recording disk system, by lowering reflectance of a laser radiating end surface partially, or by making the portion of the end surface in a direction not parallel to the opposite surface so that the portion does not function as a resonant cavity.

Some embodiments of the present invention will now be described in detail hereinblow with reference to the attached drawings.

Figure 1:
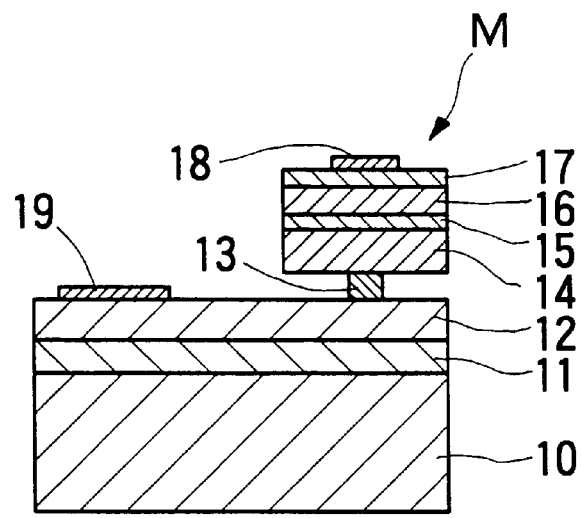
FIG. 1 shows a sectional view of a light-emitting device according to a first embodiment of the present invention.

FIG. 1 shows an outline of a structure of a blue light-emitting semiconductor laser diode according to a first embodiment of the present invention. Sequentially grown by a metal-organic chemical vapor deposition (MOCVD) process on a sapphire substrate 10 are n-GaN buffer layer 11 (Si-doped, carrier concentration: 3 to $5\times10^{18}$ cm$^{-3}$, thickness: 2 $\mu$m), n-GaN contact layer 12 (Si-doped, 3 to $5\times10^{18}$ cm$^{-3}$ 4 $\mu$m), n-AlN intermediate layer 13 (Si-doped, 3 to $5\times10^{18}$ cm$^{-3}$, 1 $\mu$m), n-GaN cladding layer 14 (Si-doped, $5\times10^{17}$ cm$^{-3}$, 0.3 $\mu$m), InO$_2$Ga$_{0.8}$N active layer 15 (undoped, 2 nm), p-GaN cladding layer 16 (Mg-doped, $5\times10^{17}$ cm$^{-3}$, 0.3 $\mu$m), GaN contact layer 17 (Mg-doped, 1 to $3\times10^{18}$ cm$^{-3}$, 0.1 $\mu$m). Here, the intermediate layer 13 functions as a current-confinement layer which narrows the electric current flowing through the device.

On the resultant surface, a mask for covering a predetermined region is formed, and a remaining region is subjected to an etching to expose n-side contact layer 12 so as to form a laminated structure of mesa-type. Next, a p-side electrode 18 is provided on the GaN contact layer 17 which is the top layer of the laminated structure, and a n-side electrode 19 is provided on the n-GaN contact layer 12.

Figure 2:
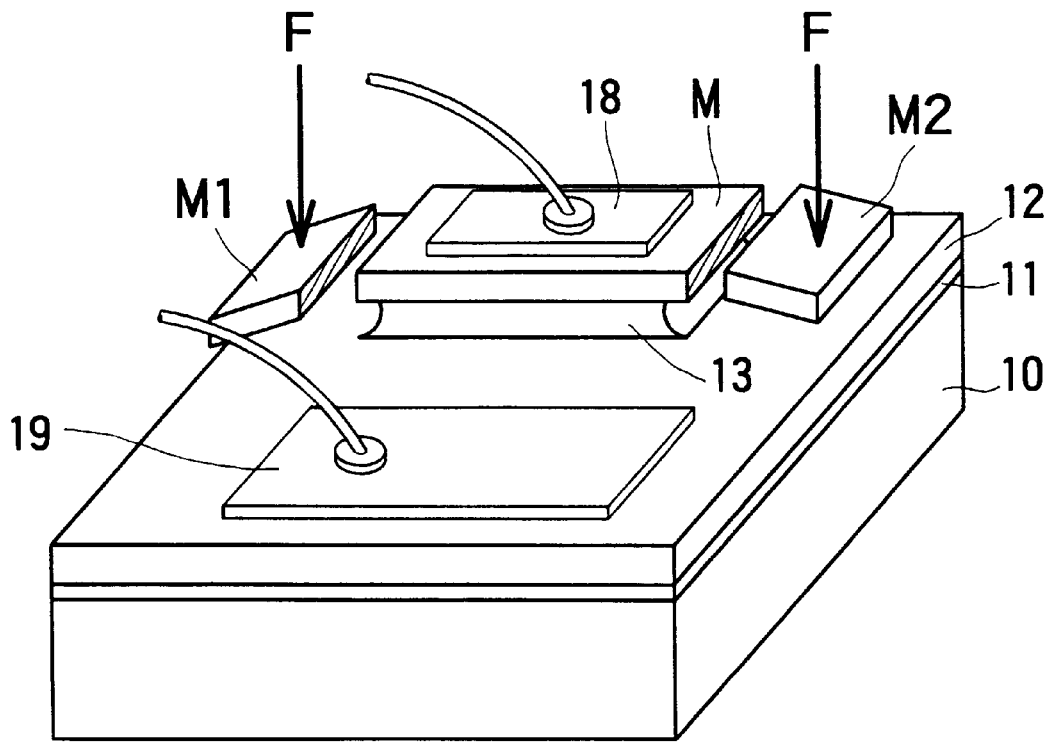
FIG. 2 shows a perspective view of a method for producing the light-emitting device shown in FIG. 11.

Thereafter, devices are cut off and separated each other by dicing the substrate wafer from the back surface. The separated devices are placed on a base which is not shown in the drawing at a certain distance from one another such that etching liquid can reach the side surfaces of the individual device, and dipped into an etching solution including phosphoric acid and fluorine and then, the AlN layer 13 is selectively subjected to the etching from a side surface thereof. That is, because the AlN layer 13 includes Al, the AlN layer 13 is selectively over-etched with respect to other layers which constitute the laminated structure M. As a result, the side surface of the AlN layer 13 is retreated inward with respect to the side surfaces of other layers, and a groove-like recess is formed around the laminated structure M. This structure is so-called a current-confinement structure in which electric current is contracted by the AlN layer 13 at the time of current application through the electrodes 18 and 19 so that current density applied to the active layer 15 can be increased. Next, each of the devices etched in the above described manner is rinsed with water, and forces F are applied to ends M1 and M2 in the vicinities of side surfaces which function as a resonator of the laminated structure M as shown in FIG. 2. With this procedure, the laminated structure M is easily cleaved at the bottom edge of the groove-like recess irrespective of a cleavage direction of the substrate 10, and the cleaved surfaces of the laminated structure M had an excellent smoothness. It is considered that this is because the cleavage is not induced by a cleavage orientation of the sapphire substrate 10 but occurred along the natural cleavage plane of the GaN layers such as In$_{0.2}$Ga$_{0.8}$N active layer 15 which is light-emitting layer, n-GaN cladding layer 14 located at opposite sides of the layer 15, p-GaN cladding layer 16, GaN contact layer 17 and the like.

Figure 3:
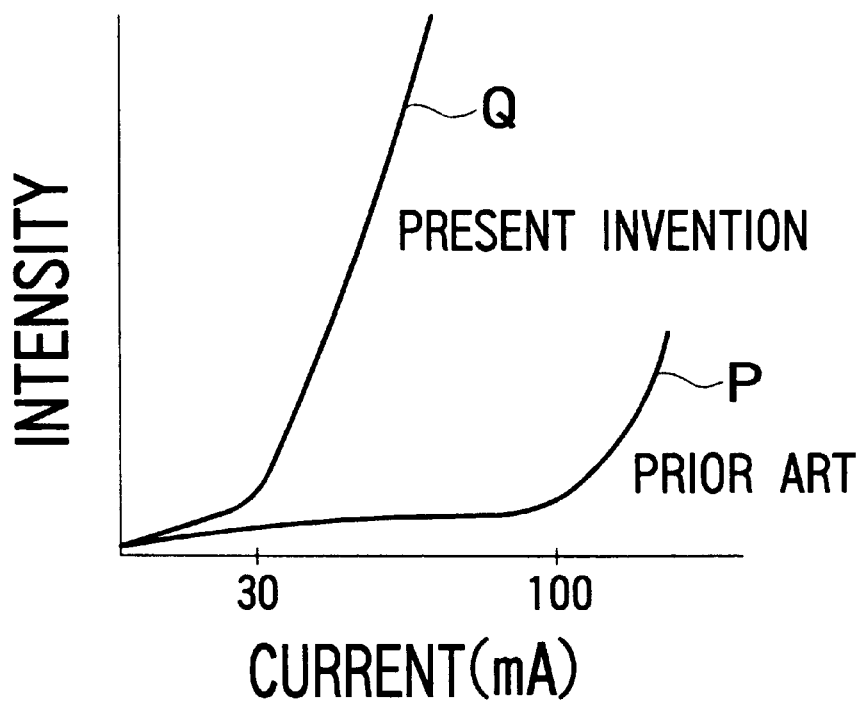
FIG. 3 shows a graph showing a relationship between applied current and emitting intensity of the light-emitting device shown in FIG. 1 in comparison with a conventional light-emitting device.

In the present embodiment, a laser oscillated continuously at room temperature at threshold current of 30 mA. Oscillation wavelength was 417 nm, and operating voltage was 8V. As shown in FIG. 3, oscillation threshold current in the present embodiment was as low as 30 mA as compared with 100 mA of a conventional device (P) which does not use the current-confinement structure. Further, deterioration was suppressed because of the excellent cleavage surface, and the light-emitting pattern was also excellent. Therefore, the light-emitting efficiency was superior to that of the conventional device as high as twice or more.

AlN intermediate (current-confinement) layer 13 may be replaced by ZnO, and the etching solution may be one which includes sulfuric acid, or one which is alkaline including ammonia. If ZnO is used, a crystal having good crystallinity could be obtained, and the ZnO was easily etched and thus, the fabricating process became easy and the yield was enhanced.

Crystal growth may be also done by a molecular beam epitaxy(MBE) process.

Figure 4:
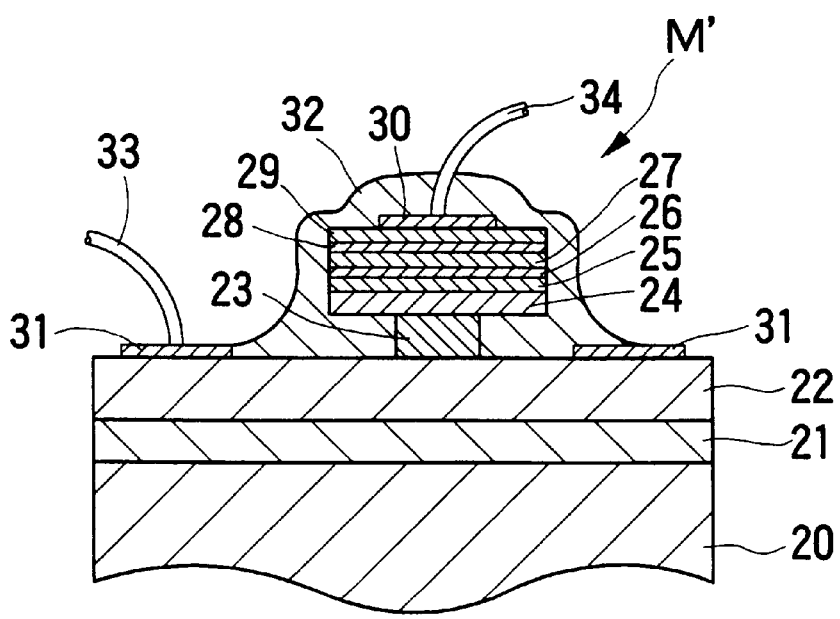
FIG. 4 shows a sectional view of a light-emitting device according to a second embodiment of the present invention.

FIG. 4 shows an outline of a structure of a blue light-emitting semiconductor laser apparatus according to a second embodiment of the present invention.

Sequentially grown by MBE process on a sapphire substrate 20 are Aln buffer layer 21 (3 to $5\times10^{18}$ cm$^{-3}$, 0.1 $\mu$m), n-GaN contact layer 22 (Si-doped, $1\times10^{19}$ cm$^{-3}$, 4 $\mu$m), ZnO intermediate layer 23 (1 $\mu$am), n-Al$_{0.5}$Ga$_{0.5}$N cladding layer 24 (Si-doped, $5\times10^{17}$ cm$^{-3}$, 0.3 $\mu$m), GaN confining layer 25 (Si-doped, 0.1 $\mu$m), In$_{0.1}$Ga$_{0.9}$N active layer 26 (Si-doped, 3 nm), GaN confining layer 27 (Si-doped, 0.1 $\mu$m), p-Al$_{0.5}$Ga$_{0.5}$N cladding layer 28 (Mg-doped, $5\times10^{17}$ cm$^{-3}$, 0.3 $\mu$m), and GaN contact layer 29 (Mg-doped, 1 to $3\times10^{18}$ cm$^{-3}$, 0.1 $\mu$m). On the resultant surface, a mask for covering a predetermined region is formed, and a remaining region is subjected to an etching to expose n-side contact layer 22 so as to form a laminated structure M of mesa-type. Next, a p-side electrode 30 is provided on the GaN contact layer 29 which is the top layer of the laminate M, and a n-side electrode 31 is provided on the n-GaN contact layer 22.

Figure 5:
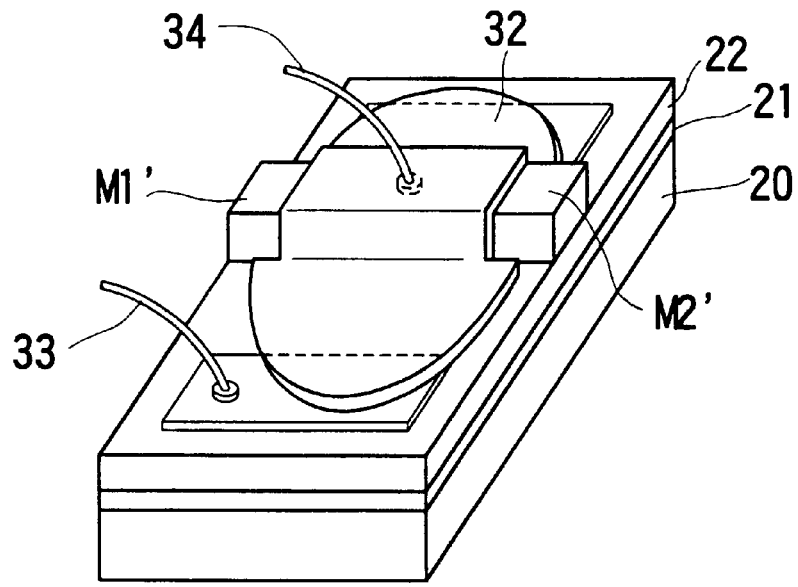
FIG. 5 shows a perspective view of the light-emitting device for showing a method for producing the light-emitting device shown in FIG. 4.
Figure 6:
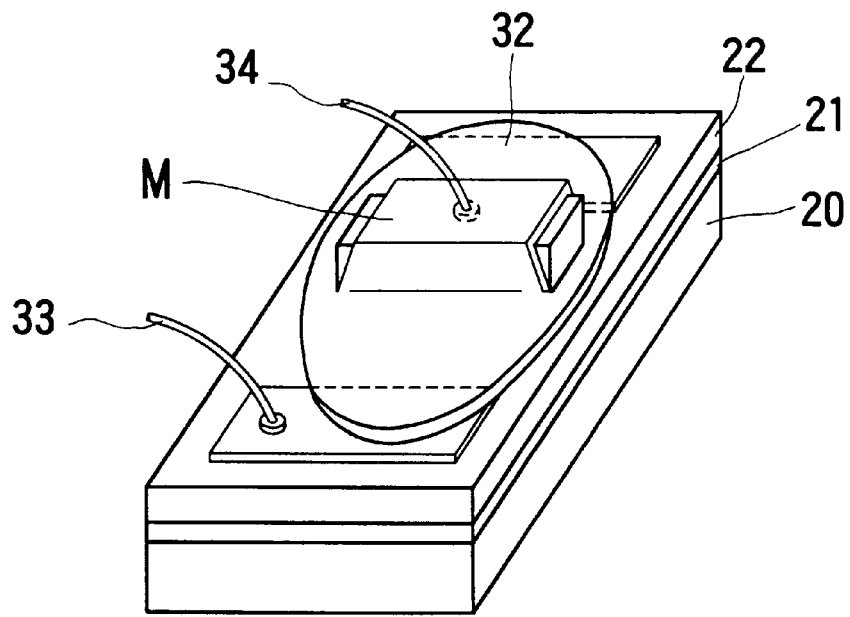
FIG. 6 shows a perspective view of the light-emitting device for showing a method for producing the light-emitting device shown in FIG. 4.

Thereafter, devices are cut off and separated one by one by dicing the substrate wafer from the back surface that constitutes the substrate 20. Each of the separated devices are mounted on a base which is not shown in the drawing, then p-side and n-side electrodes are wired to terminals of the base through Au wires 33 and 34. Next, the devices mounted on the base are dipped into the etching solution for selectively etching the ZnO intermediate layer 23 from the side surfaces thereof. With this operation the ZnO layer 23 is over-etched so that its side surface is retreated inward with respect to the side surfaces of other layers, and a groove-like recess is formed around the laminated structure M'. The devices mounted on the based are rinsed with water, thereafter, as shown in FIG. 5, a suitable amount of liquid silanol 32 is applied on the laminated structure M' of each of the devices at the center of the laminated structure M', and heated to cure the same so as to form SiO$_2$ film 32 around the laminated structure M. The devices mounted on the base are dipped into a liquid and supersonic waves are applied thereto, then, the end portion M1' and M2' shown in FIG. 5 are cleaved leaving the cleaved surfaces which function as resonant mirrors as shown in FIG. 6. With this operation, a current-confinement structure is formed by the ZnO intermediate layer 23. Because a side surface of the ZnO layer 23 is covered with SiO$_2$ which is an insulator, it is possible to prevent a current leakage flowing on the surface.

Figure 7:
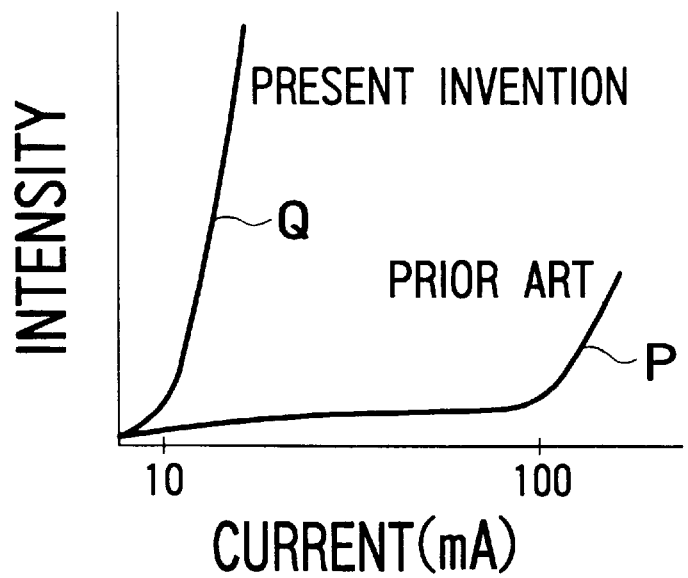
FIG. 7 shows a graph showing a relationship between applied current and emitting strength of the light-emitting device shown in FIG. 4 in comparison with a conventional light-emitting device.
Figure 8:
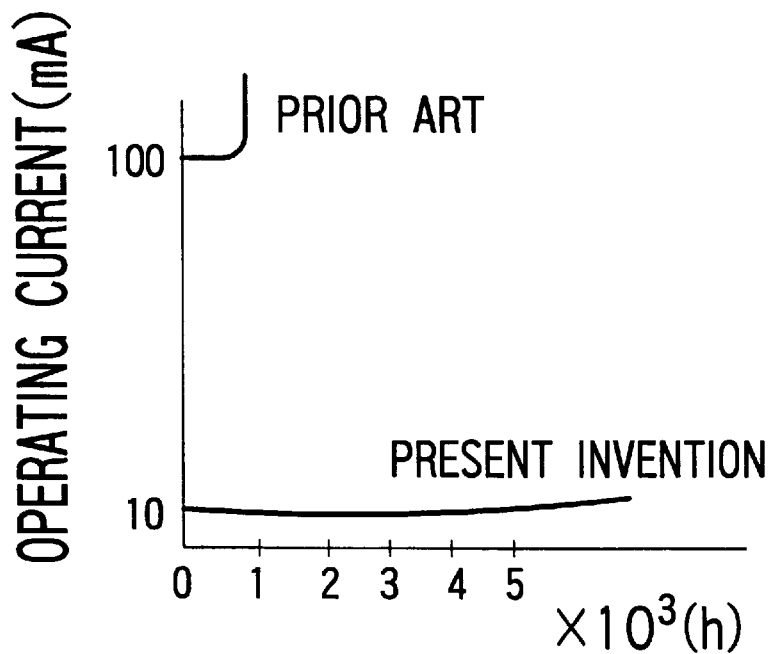
FIG. 8 shows a graph showing a relationship operating time and operating current of the light-emitting device shown in FIG. 4 in comparison with a conventional light-emitting device.

A laser device of this second embodiment oscillated continuously up to 80° C., where the threshold current was as low as 10 mA as shown by a curve Q in FIG. 7. It was also confirmed that oscillation wavelength was 383 nm, it oscillated in fundamental lateral mode, and it was stably operating up to 5,000 hours. The operating voltage of this laser device was 4V. In this device structure, since the layers neighboring with the active layer are also etched when ZnO layer 23 is etched, the current-confinement characterictics is still improved and thus, as shown in FIG. 7, the threshold current was lowered. Further, because the leak current did not flow through the surface, light-emitting efficiency was improved. Furthermore, because no electric current flows in the vicinity of the resonant mirror surfaces and thus the resonant mirrors are not damaged. Further, because the deformation of the light-emitting layer is moderated, the reliability was improved as shown in FIG. 8. Further, by increasing a thickness of the AlN buffer layer 21 up to 20$\mu$, a function as a heat sink was also realized, therefore, the temperature characteristic was improved and the laser continuously oscillated up to 100° C. Furthermore, by reducing the thickness of the n-Al$_{0.5}$Ga$_{0.5}$N cladding layer 24 down to 0.1$\mu$, the controllability of the lateral mode was well-maintained even at high output in accordance with a difference in refractive index between the cladding layer 24 and the SiO$_2$ layer 32.

Figure 9:
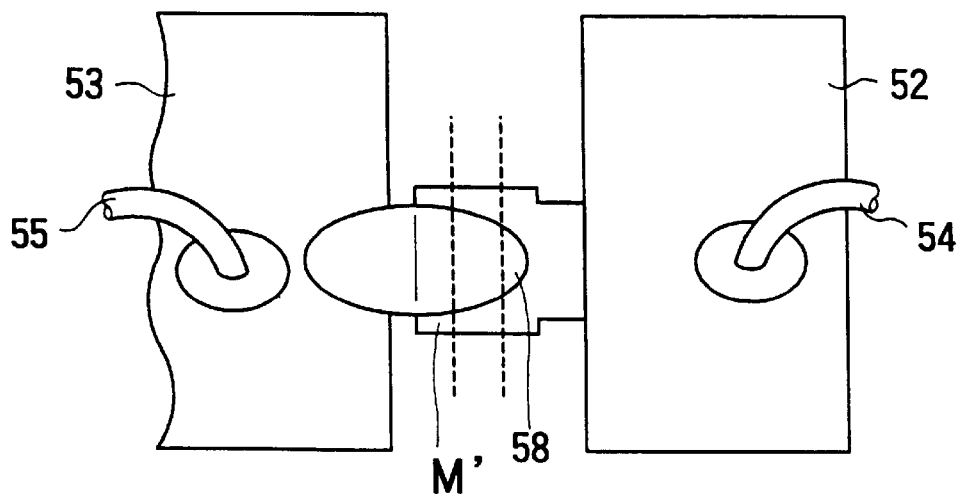
FIG. 9 shows a top view of a light-emitting device according to a third embodiment of the present invention.
Figure 10:
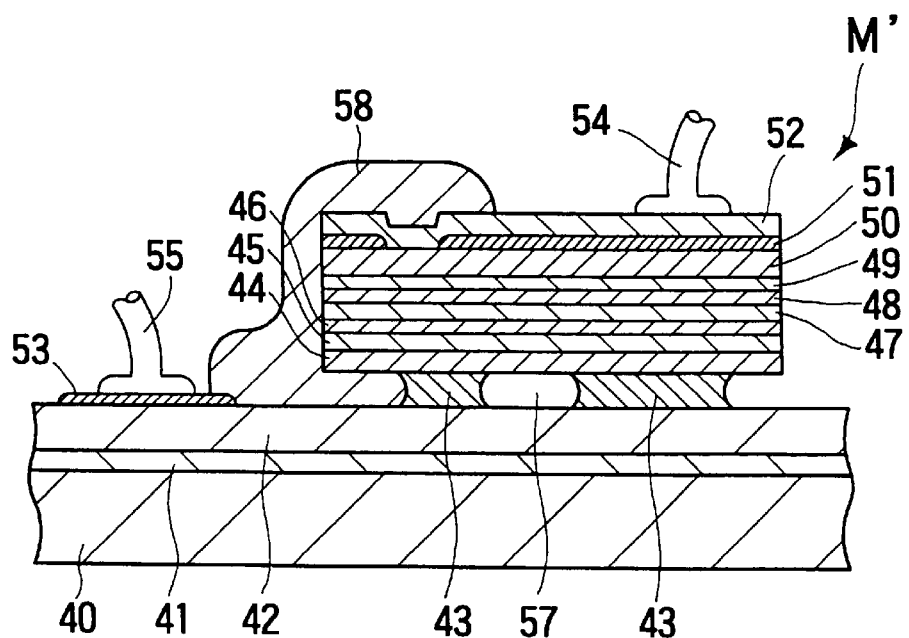
FIG. 10 shows a sectional view of the light-emitting device shown in FIG. 9.
Figure 11:
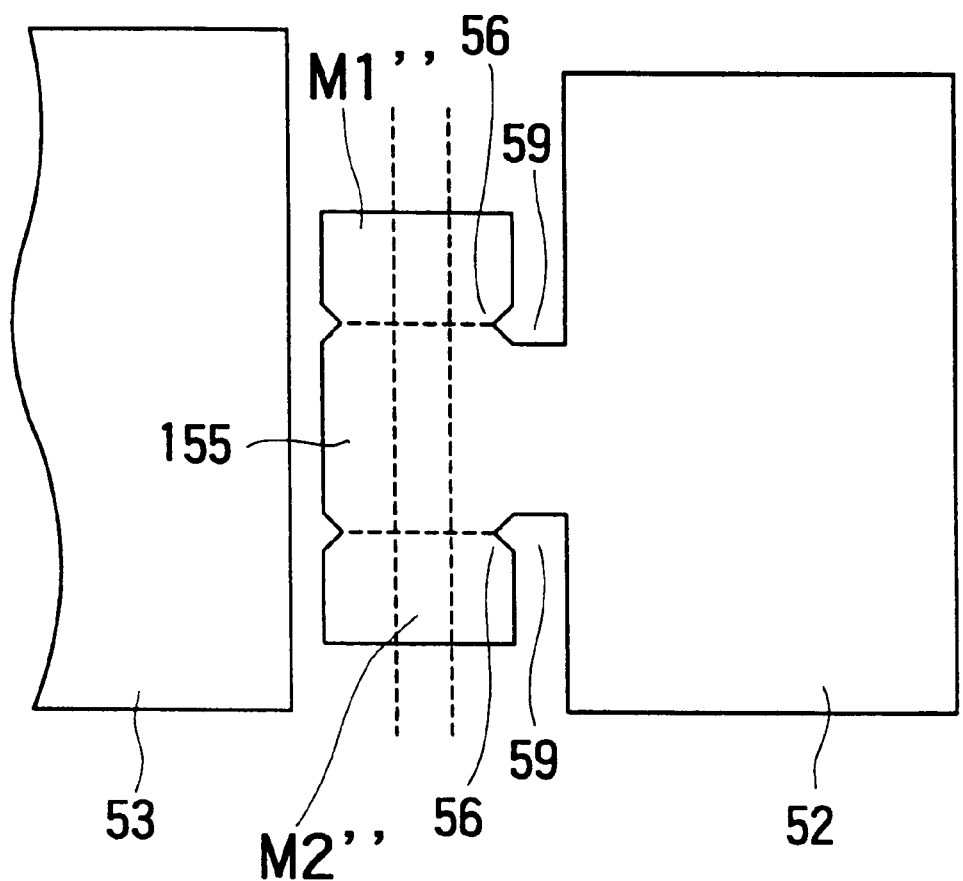
FIG. 11 shows a schematic view showing a method for producing the light-emitting device shown in FIG. 9.

Next, FIGS. 9 to 11 shows a third embodiment of the present invention, wherein FIGS. 9 and 11 are plan views, and FIG. 10 is a side view.

Sequentially grown by an MBE process on a sapphire substrate 40 are Aln buffer layer 41 (3 to $5\times10^{18}$ cm$^{-3}$, 0.1 $\mu$m), n-GaN contact layer 42 (Si-doped, $1\times10^{19}$ cm$^{-3}$, 2 $\mu$m), n-ZnO intermediate layer 43 (1 $\mu$m), n-GaN layer 44 (Si-doped, $1\times10^{19}$ cm$^{-3}$, 1 $\mu$m), n-Al$_{0.5}$Ga$_{0.5}$N cladding layer 45 (Si-doped, $5\times10^{17}$ cm$^{-3}$, 0.3 $\mu$m), GaN confining layer 46 (Si-doped, 0.1 $\mu$m), In$_{0.1}$Ga$_{0.9}$N active layer 47 (Si-doped, 3 nm), GaN confining layer 48 (Si-doped, 0.1 $\mu$m), p-Al$_{0.5}$Ga$_{0.5}$N cladding layer 49 (Mg-doped, $5\times10^{17}$ cm$^{-3}$, 0.3 $\mu$m), and GaN contact layer 50 (Mg-doped, 1 to $3\times10^{18}$ cm$^{-3}$, 0.1 $\mu$m). Then, the substrate 40 on which these growing layers are laminated is taken out from a growing chamber, SO$_2$ insulating film 51 is formed on the p-GaN contact layer 50, a portion of the film 51 is etched into a stripe shape (as shown by broken lines in FIG. 9) such that the portion reaches the p-GaN contact layer 50, and Ni is deposited thereon. Thereafter, a mask having a shape as shown in FIG. 11 is formed of Ti on the surface of Ni, and the etching is conducted to reach the n-GaN contact layer 42. Then, another mask is formed on the surface except the region on which the n-side electrode 53 is to be formed, Ti is deposited to form a p-side electrode 52. Then, the mask is removed. Next, the entire body except the area from which the mask was removed is etched to reach the n-side contact layer 42 to form the n-side electrode 53. A p-side lead wire 54 and a n-side lead wire 55 are connected to the p-side electrode 52 and the n-side electrode 53, respectively.

FIG. 11 shows a schematic view of a shape of the light-emitting device at this step. FIG. 11 illustrates a top view of a single light-emitting device region. The light-emitting device comprises the p-side electrode 52 to which the p-side lead wire 54 is connected, the laser device body 155 connected to the p-side electrode 52, and the n-side electrode 53. By comparing FIG. 11 with FIG. 9, it can be found that a cleaved surfaces 56, 56 which function as resonator mirrors have not been formed yet in FIG. 11. Then, as in the previous embodiment, the entire substrate 40 is dipped into etching solution to selectively etch the ZnO layer from the side surfaces thereof. With this procedure, the ZnO intermediate layer 43 is overetched, its side surfaces are retreated inward with respect to the remaining side surfaces of the mesa-type laminated structure M', and a groove-like recess 56 is formed around the laminated structure M'. As shown in FIG. 10, a through hole 57 is also formed in the intermediate ZnO layer 43 by the etching process. This through hole 57 is formed by the over-etching of the ZnO layer 43 at the portion between the pair of the grooves 59,59.

After the etching is completed, light-emitting device is rinsed with water, devices are cut off and separated one by one by dicing the substrate wafer from the back surface. Each of the separated devices are mounted on a base which is not shown, and the n-side electrode 53 and the p-side electrode 54 are wired to terminals of the base through Au wire leads 54 and 55, respectively. Then, although it is not shown, by applying supersonic waves, the end portions M1" and M2" of the mesa-type laminated structure M' shown in FIG. 11 are cleaved off, and a completed device as shown in FIG. 10 is obtained. Next, as shown in FIG. 9, a suitable amount of liquid silanol compound 58 is applied on the mesa-type laminated structure M' of the laser device at the center of the M', then heated to cure the same to oxidize the silanol compound 58 so as to form $SiO_2$ film 58 which covers side surface of the mesa-type laminated structure The laser device completed in this manner forms a current-confinement structure by the ZnO layer 43 as shown in FIG. 10, the side surface thereof is covered with the $SiO_2$ film 58 and therefore, it is possible to prevent the leak current which may flow through the surface. Most important improvement is that it is possible, by the production process, to shorten the distance between the mirror surfaces of the mesa-type laminated structure M' which is a length of the resonant cavity of the laser device body 155, and a width of the stripe-shaped ZnO layer 43 extended between the mirror surfaces. With this improvment, it is possible to reduce the threshold current and the operating power. When the length of the resonant cavity is 100 μm and the width of the stripe is 5 μm, the threshold current becomes 1 mA. Therefore, the reliability of the device is also enhanced due to the lowered drive current.

The laser device of the third embodiment continuously oscillated up to 80° C. at threshold value 3 mA. It was also confirmed that the oscillating wavelength was 390 nm, the device oscillated in fundamental lateral mode, and the device was stably operated up to 5,000 hours. The operating voltage was 3.8V.

Next, a fourth embodiment of the present invention will be described.

Figure 12:
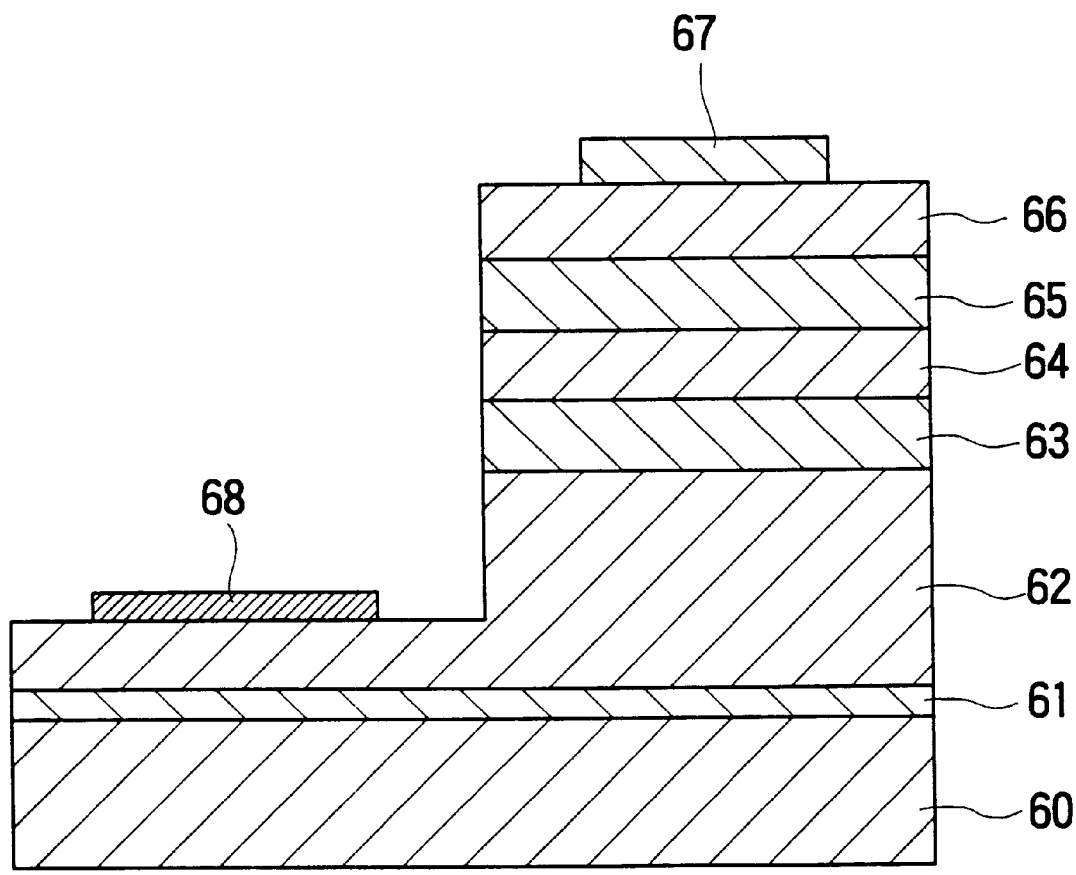
FIG. 12 shows a mimetic diagram showing a sectional structure of a blue semiconductor laser apparatus according to a fourth embodiment of the present invention.

FIG. 12 shows a diagram showing a sectional structure of a blue light-emitting semiconductor laser apparatus according to the fourth embodiment of the present invention. In FIG. 12, the reference numeral 60 denotes a sapphire substrate, the reference numeral 61 denotes n-AlN intermediate layer (Si-doped, carrier density: 3 to $5 \times 10^{18}$ cm$^{-3}$, layer thickness: 100 nm), the reference numeral 62 denotes n-GaN contact layer (Si-doped, 3 to $5 \times 10^{18}$ cm$^{-3}$, 4 μm), the reference numeral 63 denotes n-$Al_{0.5}Ga_{0.5}N$ cladding layer (Si-doped, $5 \times 10^{17}$ cm$^{-3}$, 0.3 μm), the reference numeral 64 denotes $In_{0.2}Ga_{0.8}N$ active layer (undoped, 3 nm), the reference numeral 65 denotes p-$Al_{0.5}Ga_{0.5}N$ cladding layer (Mg-doped, $5 \times 10^{17}$ cm$^{-3}$, 0.3 μm), the reference numeral 66 denotes p-GaN contact layer (Mg-doped, 1 to $3 \times 10^{18}$ cm$^{-3}$, 0.1 μm), the reference numeral 67 is a p-side electrode and the reference numeral 68 denotes a n-side electrode. The growth of crystal of each of the semiconductor layers as denoted by the reference numerals 61 to 66 is carried out by an MOCVD process.

In the fourth embodiment also, after crystal of the laminated structure shown in FIG. 12 was grown, a device fabrication process was conducted.

Figure 13:
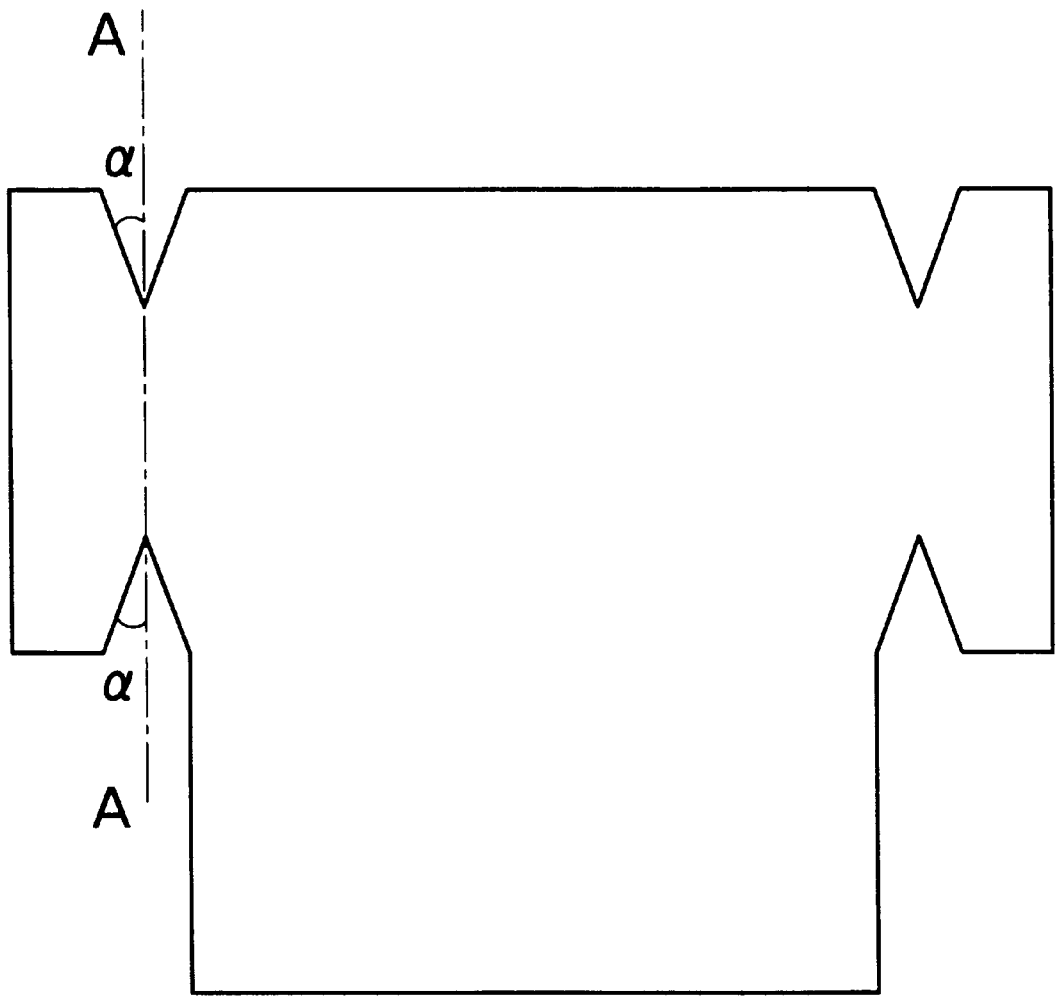
FIG. 13 shows a mimetic diagram showing a shape of an etching mask used in the fourth embodiment.

FIG. 13 shows a diagram showing a shape of an etching mask used in the fourth embodiment. More specifically, after the above-described crystal growing process, a mask having a shape as shown in FIG. 13 is formed on the contact layer 66, and a portion which is not covered with the mask is etched to reach the substrate 60. This etching is preferably an etching which can etch vertically with respect to the substrate and which does not have any preference that depends on the composition of each of the layers of the semiconductor layers 61 to 66. An example of the preferable etching method is a dry etching. More specifically, it is preferable to conduct a reactive ion beam etching using ECR (Electron Cyclotron Resonance) etching apparatus, and using, as an etching gas, a mixed gas or a single gas including any one of $CF_4$, $SF_6$, $BCl_3$ and $Cl_2$.

When a mask is formed on a nitride gallium crystal layer, the mask should be formed such that the line A—A in FIG. 13 is parallel to a cleavage plane of the nitride gallium based compound semiconductor. Here, the cleavage plane of the nitride gallium based compound semiconductor is any one of (1-100), (10-10), (01-10), (-1100), (-1010) and (0-110). These planes are deviated from the cleavage plane of the sapphire substrate. By the method of the present invention, the nitride gallium based compound semiconductor crystal can easily cleaved along its natural cleavage plane which is not in parallel direction as that of the sapphire substrate.

Figure 14:
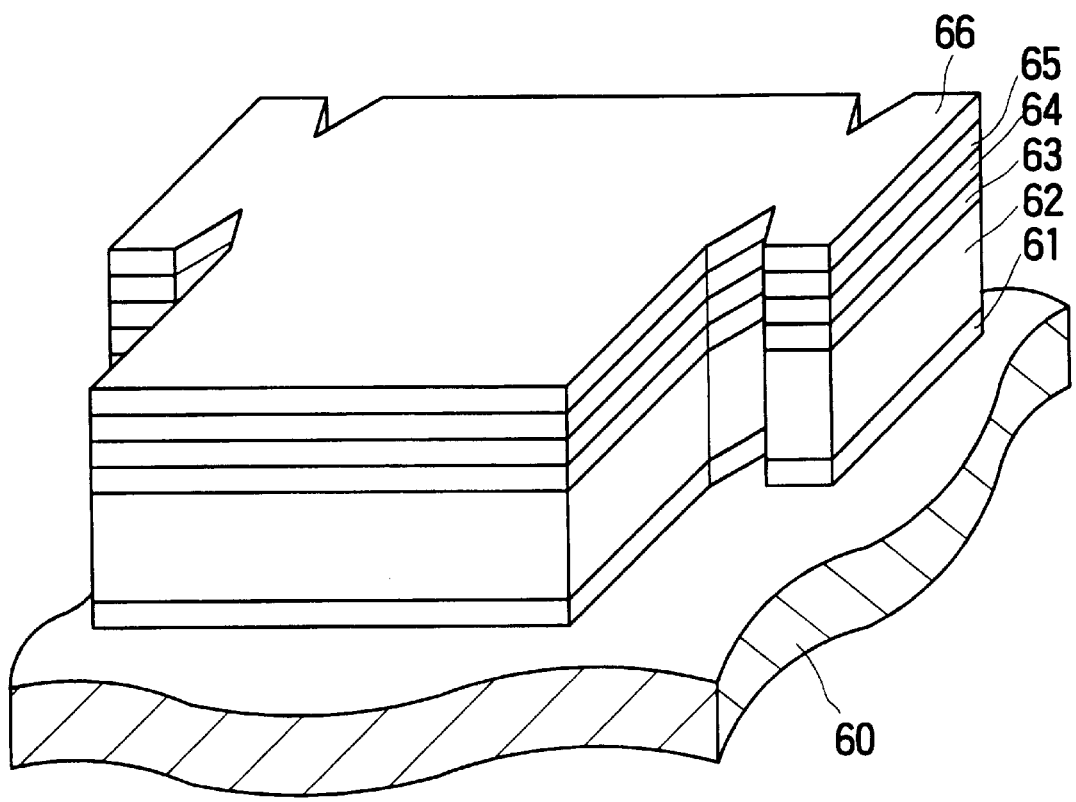
FIG. 14 shows a schematic perspective view showing a shape after etching.

FIG. 14 shows a schematic perspective view showing a shape after this etching process. As shown in FIG. 14, the semiconductor layers 61 to 66 has a side surface with a shape cut into wedges with respect to a width direction.

Next, the AlN intermediate layer 61 which is exposed on the side surfaces of the semiconductor layers is selectively etched. An wet etching process using an etching solution such as phosphoric acid, aqua regia and SH (sulfuric acid:hydrogen peroxide:water=5:1:1) may be used. That is, because the AlN layer 61 includes aluminum, the layer 61 is selectively etched by these etching solutions. Further, by increasing the temperature of the etching solution, the etching speed is increased and the speed for carrying out the process can be increased.

Figure 15A:
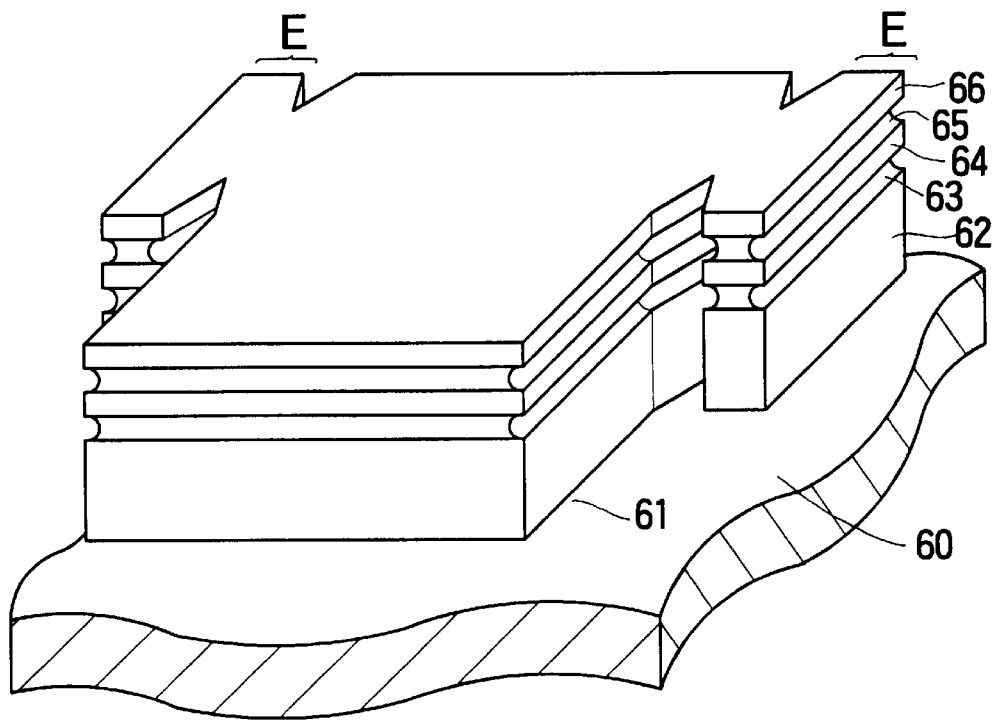
Figure 15B:
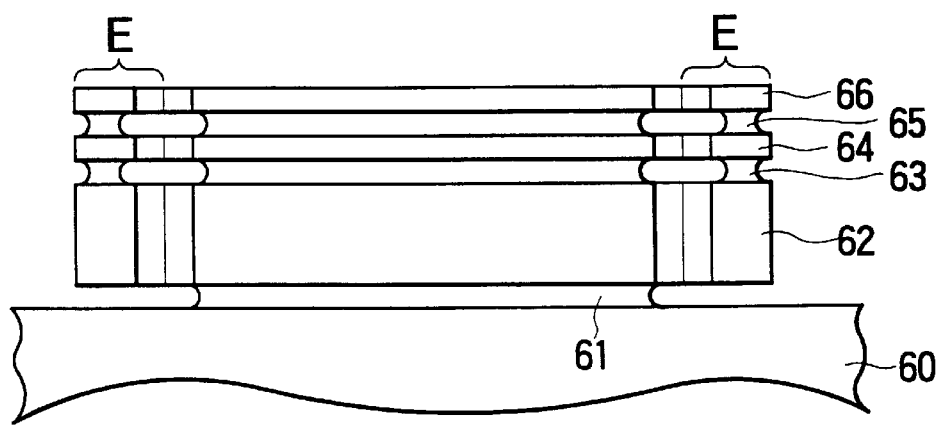

FIGS. 15a and 15b are schematic diagrams showing the shape of the semiconductor layers after the etching process, wherein FIG. 15a shows a schematic perspective view of the semiconductor layers, and FIG. 15b shows a schematic front view taken along the arrow shown in FIG. 15a. As shown in FIGS. 15a and 15b, in this etching process, the etching is conducted until the AlN intermediate layer 61 under the end portions E,E of the semiconductor layers. By etching and removing the part of the AlN intermediate layer 61 in this manner, the end portions E,E become separated from the substrate 60 and stick out so that cleaving operation can easily be conducted as will be described later.

Next, a portion which becomes the p-side electrode is subjected to a masking, and the laminated structure is etched until the n-GaN layer 62 is exposed. Electrode material is deposited to form the n-side electrode 68. Thereafter, it is dipped into a solution, and supersonic waves are applied to the solution, thereby cleaving the end portions to form the mirror-like end surfaces.

Figure 16:
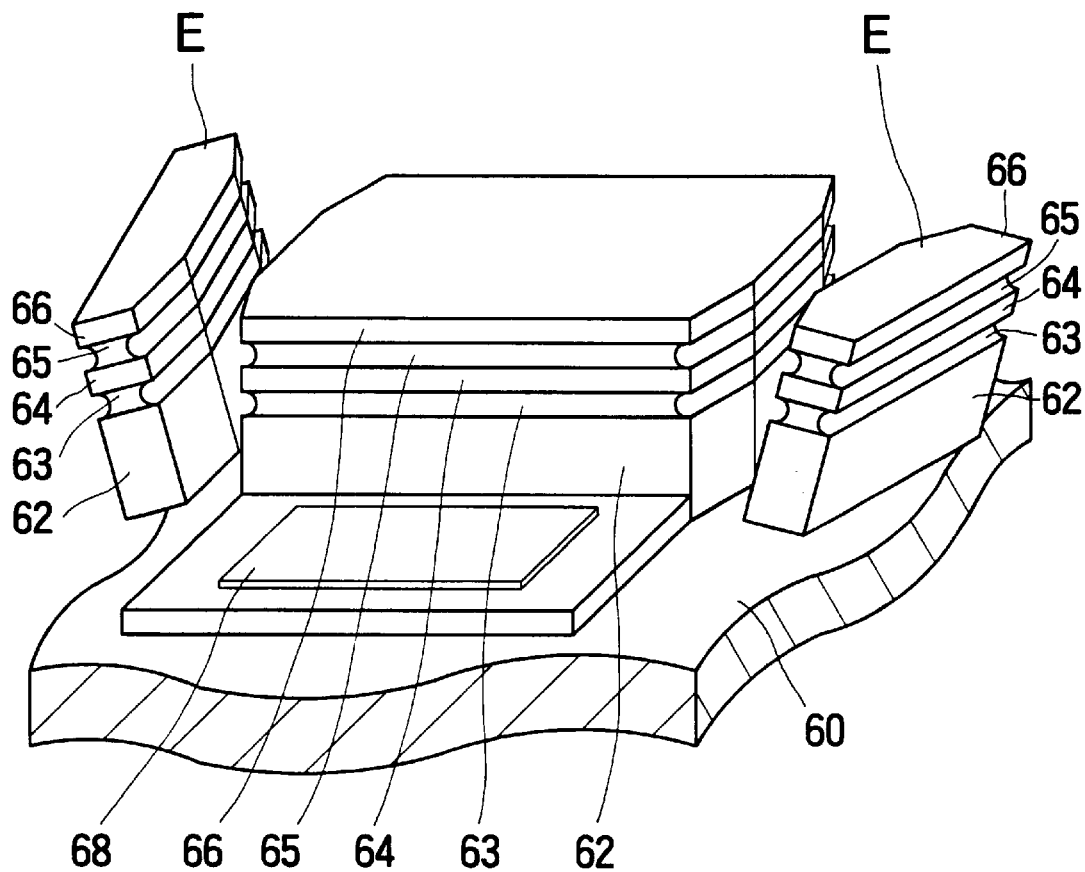
FIG. 16 shows a schematic diagram showing a state in which an end surface portion is cleaved.

FIG. 16 is a schematic diagram showing a state in which the end portions are cleaved off. According to the present invention, a direction of the wedges of the mask shown in FIG. 13 is directed along the natural cleavage plane of the nitride gallium based semiconductor, as described above. Therefore, it is possible to concentrate the stress along the cleavage plane of the nitride gallium based semiconductor so that the cleavage can easily be conducted. Further, according to the present invention, the end portions E which are to be cleaved off are separated from the substrate and are sticking out the air by etching and removing the lower AlN layer 61 and therefore, it is possible to cleave the nitride gallium based semiconductor irrespective of the direction of the cleavage of the substrate 60.

After that, the substrate 60 is subjected to the dicing to cut off each of the devices together with the substrate 60.

Figure 17:
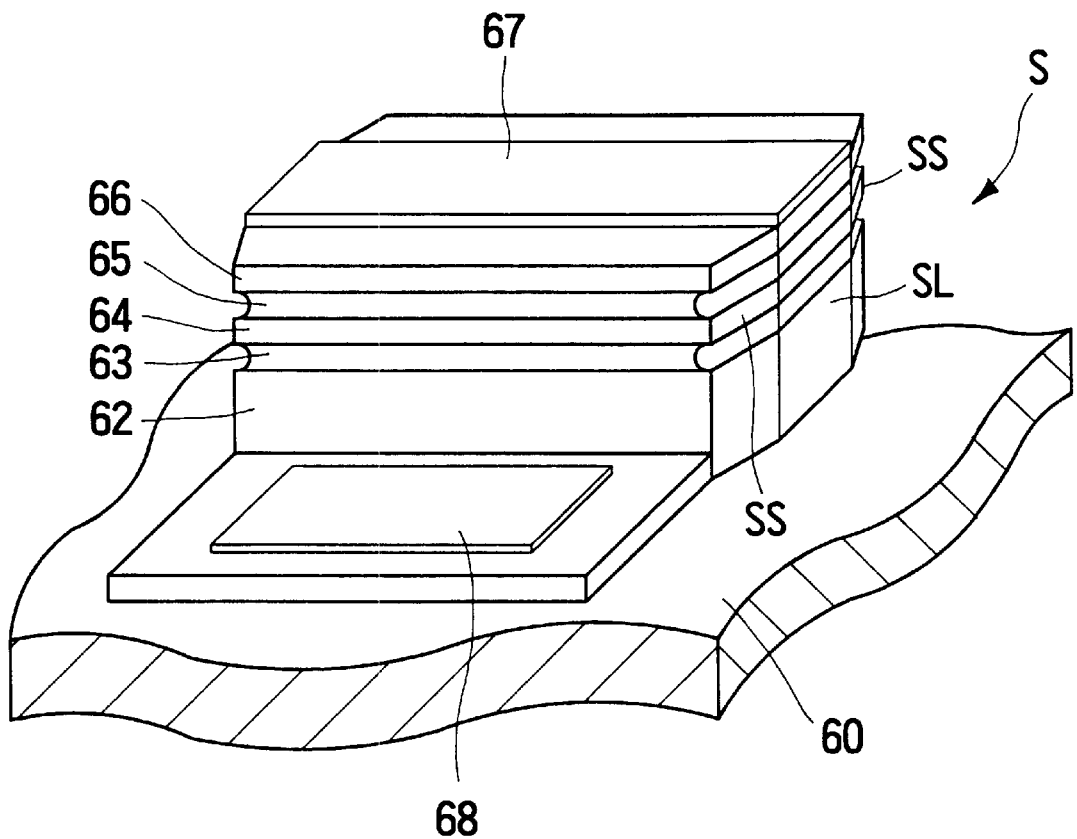
FIG. 17 shows a schematic perspective view of a completed semiconductor light-emitting device according to the fourth embodiment.

FIG. 17 is a schematic perspective view of a completed semiconductor light-emitting device. In an end surface S of the completed device, a layer including aluminum has a recess shape which recede from the peripheral layers including no aluminum. A depth of the recess is larger as the content of aluminum is larger. For this reason, not only the AlN layer 61 on the substrate 60, but also the cladding layers 63 and 65 are etched and formed at their side surfaces with recesses. However, a cleavage surface SL is not exposed at the time of etching of the AlN layer, and is exposed after the end portions E,E are cleaved off by the supersonic waves. Therefore, a recess is not generated on the cleavage surface SL, and there is no influence on the oscillating operation of the laser.

It should be noted that the process for etching by the mask having the wedge-shape may be conducted after the process for exposing the n-contact layer by etching for forming the n-side electrode.

Other processes having the sequence different from that described above may be also conducted as well. However, if the processes are conducted in the different sequence, it is necessary to suitably vary the shape of the mask. The mask illustrated in FIG. 13 has a shape in which one device is separated and independent from other device. However, the present invention should not be limited to this shape, and it is possible, for example, to use a mask having a shape in which each of the devices which are adjacent on the wafer are arranged such that they are contacted with one another.

The present inventors conducted the following test. That is, the light-emitting device according to the present embodiment was mounted on a test jig, and operation test was performed. The device was continuously oscillated at the threshold current of 150 mA at a room temperature. The oscillation wavelength was 422 nm, and the operating voltage was 4V. And it was found out that a life span of the device was extremely long, and was ten times or more as long as an device whose end surfaces was formed by a usual dry etching, or an device whose end surfaces was formed by a method in which a substrate or a grown surface is scratched and is broken from the crack.

Further, a light-emitting pattern of the laser was checked, and it was found that only one portion has the maximum emission intensity, which was the most suitable pattern for reading and writing of the laser disks. This result reflects that the light-emitting device according to the present embodiment oscillates in the fundamental lateral mode. It was confirmed that the reason was that there existed portions having a lower reflectance on the end surfaces and therefore, a higher-order mode at the outside was cut off, and the light-emitting device oscillated only in the fundamental mode.

More specifically, in the present embodiment, because the etching is conducted in the wedge-shape using the mask as shown in FIG. 13, it was found that the surface portion SS,SS locating at the left hand and the right hand of the cleavage surface SL respectively, are inclined, and are not in parallel to each other so that they can not function as resonant mirrors and therefore, an laser oscillation in the higher-order mode is not generated around this area even if the laser is operated at a high power output condition.

Meanwhile, in the present invention, it is also possible to form the end surfaces of the laser into a flat shape by varying the shape of the mask.

Figure 18:
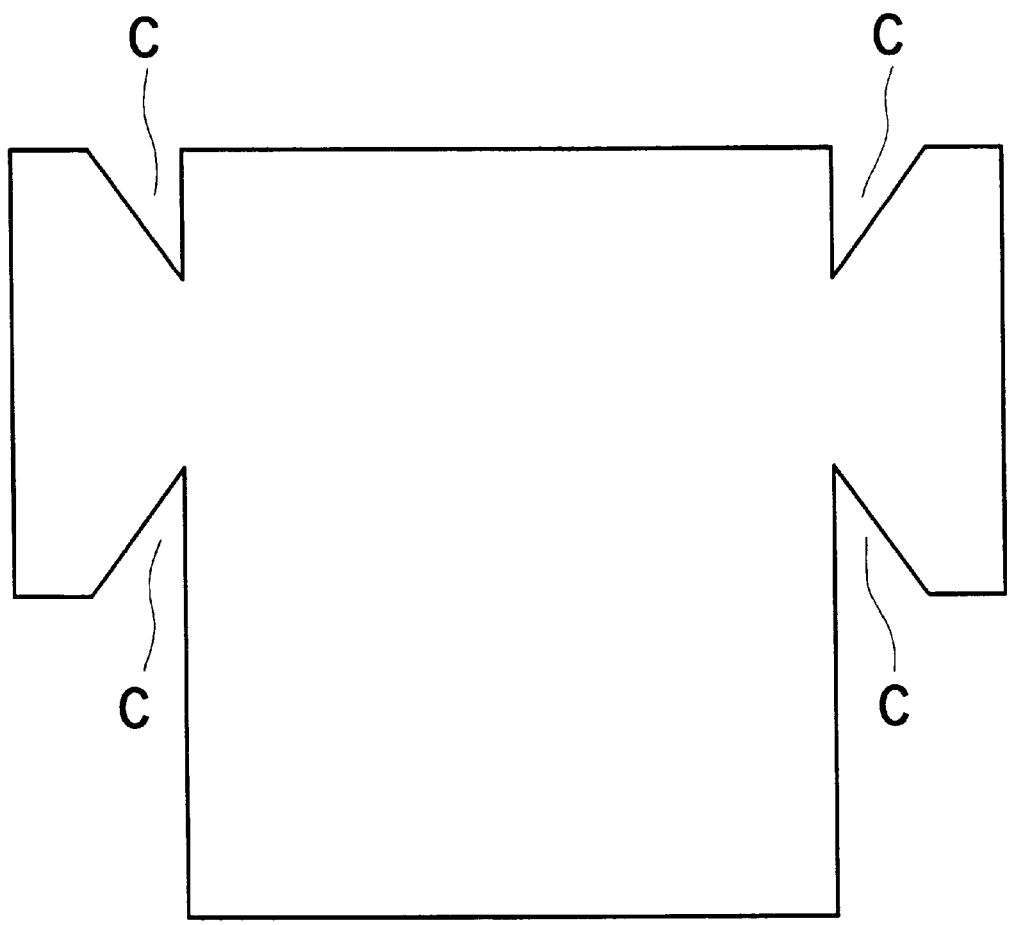
FIG. 18 shows a schematic diagram showing a mask as an example.

FIG. 18 shows a schematic diagram showing such a mask as an example. That is, the mask can be formed into a wedge-shape C in which end surface portion of the light-emitting device is formed flatly. Even with the end surfaces of the light-emitting device formed by a similar process as described above using this mask, the reflectance at the cleaved surfaces and the reflectace at the adjacent etched surfaces can be different from each other. The reason is that the etched surfaces which are formed by etching the semi-conductor layers vertically to the substrate in wedge shape do not become a mirror surface, but becomes rough surface having fine unevenness. Such a rough etching surface can easily be obtained by a dry etching process and the like while suitably adjusting the etching conditions.

More specifically, when the etching mask as shown in FIG. 18 is used, the end surface of the light-emitting device can be formed into a substantially flat shape. Further, the laser emitting portion is formed with a mirror surface by the cleaved surface, and its left and right portions can be formed as the etched rough surfaces having low reflectance. In this case, because the left and right surfaces of the cleaved surface can not function as resonant mirrors, an laser oscillation is not generated in the higher-order mode around this area even if the laser is operated at a high output condition, and the fundamental lateral mode can be maintained.

Meanwhile, in the present embodiment, the AlN buffer layer 61 may also be replaced by ZnO. In such a case, each of layers which grow thereon has excellent crystal properties, thereby providing an effect that a characteristic of the light-emitting device can be improved enhanced. In this case, aqua regia or hydrochloric acid etching solution can be used as an etching solution.

Further, InGaN layer may be used instead of the AlN buffer layer 61. In such a case, there is provided effect that an amount of deformation of the crystal layer which grows thereon is adjusted so that even if a content of aluminum in the AlGaN layer is increased, a crack is not generated in the crystal. Furthermore, the InGaN layer functions as a light-absorbing layer which controls the lasing mode and generates a self-oscillation, and a high frequency driving can easily be realized. As an etching liquid in this case, a bromine etching solution or hydrochloric acid etching solution can be used.

In the present embodiment, although an MOCVD process has been used as a growing method of the crystal, other processes such as an MBE process, a chemical beam epi-taxial (CBE) process, an metal-organic molecular beam epitaxy (MOMBE) process and a hydride CVD process can be used.

Furthermore, concerning the shape of the etching mask as shown in FIG. 13, the laser oscillation was observed when the wedge-like portion had an angle α between 0 to 45° with respect to the laser emitting end surface, and when the angle α was equal to 0°, the maximum laser output with respect for the current was obtained, however, when α was near 10°, the lateral mode could be suppressed most effectively. When the angle α was larger than that, the lateral mode was well suppressed, however, the output power tended to decreased.

Figure 19:
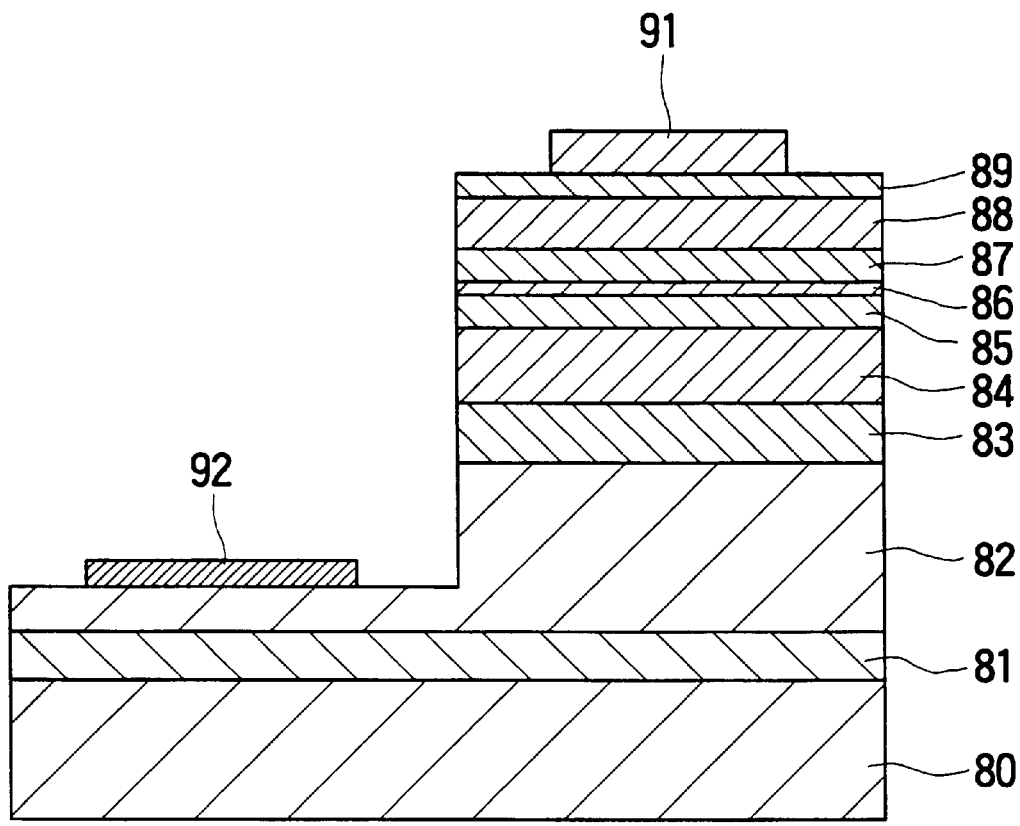
FIG. 19 shows a schematic diagram showing a sectional structure of a blue semiconductor laser apparatus according to a fifth embodiment of the present invention.

Next, a fifth embodiment will be described. FIG. 19 shows a schematic diagram showing a sectional structure of a blue semiconductor laser apparatus according to the fifth embodiment of the present invention. More specifically, a sapphire substrate 30 includes a laminated structure in which the following layers are sequentially grown: GaN buffer layer 81 (3 to $5\times10^{16}$ cm$^{-3}$), n-GaN contact layer 82 (Si-doped, $1\times10^{18}$ cm$^{-3}$), n-ZnO intermediate layer 83 (Cl-doped, $1\times10^{19}$ cm$^{-3}$, 1 μm), n-Al$_{0.5}$Ga$_{0.5}$N cladding layer 84 (Si-doped, $5\times10^{17}$ cm$^{-3}$, 0.3 μm), GaN confining layer 85 (undoped, 0.1 μm), In$_{0.2}$Ga$_{0.8}$N/GaN 3MQW active layer 86 (undoped, well layer 2 nm, obstacle layer 4 nm), GaN confining layer 87 (undoped, 0.1 μm), p-Al$_{0.5}$Ga$_{0.5}$N cladding layer 88 (Mg-doped, $5\times10^{17}$ cm$^{-3}$, 0.3 μm), and GaN contact layer 89 (Mg-doped, 1 to $3\times10^{18}$ cm$^{-3}$, 0.1 μm). The reference numeral 91 denotes a p-side electrode and the reference numeral 92 denotes a n-side electrode.

The crystal growth was conducted by an MBE process. Then, a portion which will become the p-side electrode is formed with a mask as shown in FIG. 13, and other portions are etched to reach the n-side contact layer 82 to form the n-side electrode 92. Next, the resultant is dipped into an etching solution to etch the ZnO layer 83 from its side surface. As the etching solution, aqua regia or hydrochloric acid etching solution can be used. With this procedure, the ZnO layer 83 is etched such that the side surface of the ZnO layer 83 is retreated inward with respect to the side surfaces of other layers to form a recess. Further, at the time of rinsing with water after etching, the device is exposed to a strong water current so that the tip end portions are cleaved off at the wedge-like etched portions and are removed. Alternatively, supersonic waves may be applied in the water for cleaving the tip end portions off. When such a wedge-like etched portions were not formed, desired end mirror surfaces could not be obtained, and the production yield was decreased.

Figure 20:
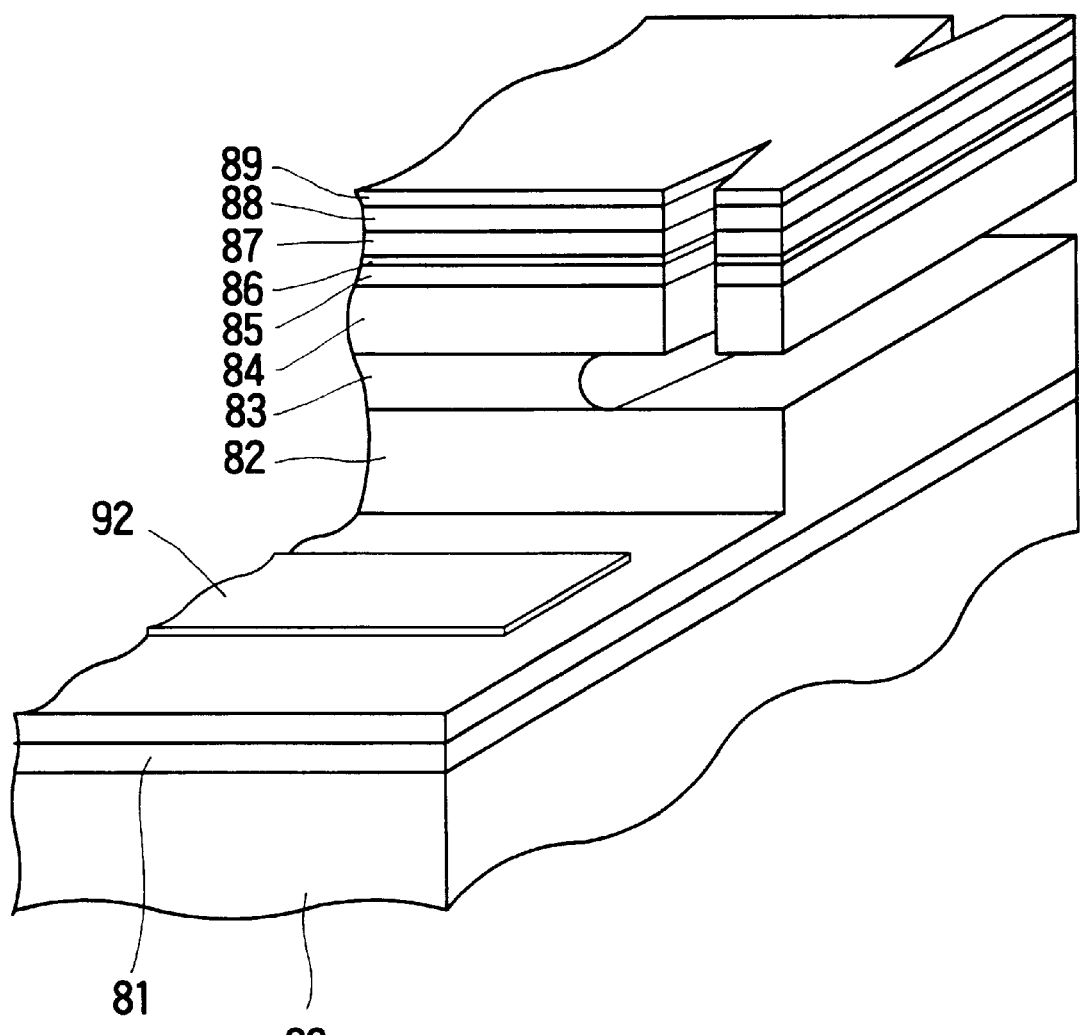
FIG. 20 shows a schematic perspective view showing a shape of an essential portion of a light-emitting device before being cleaved according to the fifth embodiment.

FIG. 20 shows a schematic perspective view showing the above described shape of an essential portion of a light-emitting device before being cleaved.

The Inventors conducted the following test. The light-emitting device according to the present embodiment was continuously oscillated at up to 80° C. at the threshold current of 100 mA. Further, it was confirmed that the oscillation wavelength was 418 nm, and the device was oscillated in the fundamental lateral mode, and the device has stably operated for up to 5,000 hours. The operating voltage of the device was 4V.

In the present embodiment, as shown in FIG. 20, the ZnO layer 83 is retreated inward with respect to a side surface of the device by the etching. As a result, the device has a so-called "window structure" in which the electric current is narrowed and no electric current flows in the vicinity of the end mirror surfaces. Accordingly, there is provided an effect that the catastrophic optical damage (COD) due to the electric current flowing through the vicinity of the mirror surface is suppressed and thus, the reliability of the light-emitting device is markedly improved.

In the present embodiment also, the crystal growth process should not be limited to an MBE process. Other processes such as an MOCVD process, a chemical beam epitaxial (CBE) process, an metal-organic molecular beam epitaxy (MOMBE) process and a hydride CVD process can be also used.

Next, a sixth embodiment of the present invention will be described.

Figure 21:
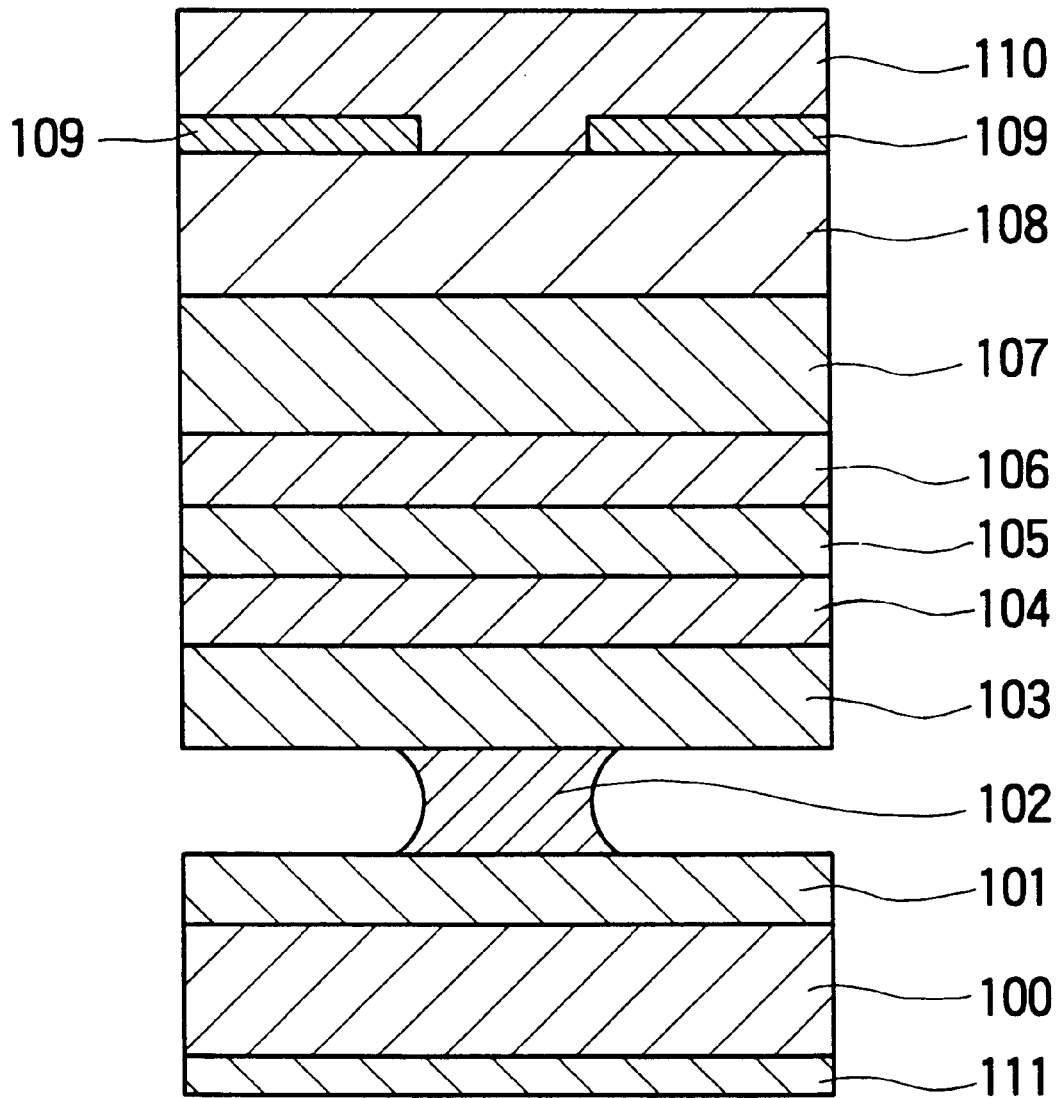
FIG. 21 shows a schematic diagram showing a sectional structure of a blue semiconductor laser apparatus according to a sixth embodiment of the present invention.

FIG. 21 shows a schematic diagram showing a sectional structure of a blue light-emitting semiconductor laser apparatus according to the sixth embodiment of the present invention. Here, the reference numeral 100 denotes n-type 6H-SiC substrate, the reference numeral 101 denotes n-AlN buffer layer (Si-doped, 3 to $5\times10^{18}$ cm$^{-3}$, 100 nm), the reference numeral 102 denotes n-ZnO intermediate layer (Si-doped, 3 to $5\times10^{18}$ cm$^{-3}$, 4 μm), the reference numeral 103 denotes n-Al$_{0.3}$Ga$_{0.7}$N cladding layer (Si-doped, $5\times10^{17}$ cm$^{-3}$, 0.3 μm), the reference numeral 104 denotes GaN guiding layer (undoped, 0.1 μm), the reference numeral 105 denotes In$_{0.2}$Ga$_{0.8}$N active layer (undoped, 3 nm), the reference numeral 106 denotes GaN guiding layer (undoped, 0.1 μm), the reference numeral 107 denotes p-Al$_{0.3}$Ga$_{0.7}$N cladding layer (Mg-doped, $5\times10^{17}$ cm$^{-3}$, 0.3 μm), the reference numeral 108 denotes p-GaN contact layer (Mg-doped, 1 to $3\times10^{18}$ cm$^{-3}$, 0.1 μm), the reference numeral 109 is SiO$_2$ insulating film, the reference numeral 110 denotes a p-side electrode and the reference numeral 111 denotes a n-side electrode.

The crystal growth was conducted by an MOCVD process. After the crystal growth was conducted, the SiO$_2$ film 109 was selectively formed and then, the p-side electrode 110 was formed. Because the SiC substrate is conductive, the n-side electrode 111 can be formed on a back surface of the substrate 100. Surfaces which will become the laser ejecting end surface were formed by the cleaving, and the devices were separated each other by dicing along the direction perpendicular to the mirror surfaces. Next, each of the devices is mounted on a heat sink such that its p-side electrode is directed downward, and are dipped into alkaline etching solution. By this etching procedure, the ZnO layer 102 is etched from its side surface, and an electric current-confinement structure is realized. In this laser device, since the electric current is narrowed, no electric current flows through the vicinity of the end mirror surfaces. Therefore, it is possible to prevent a sudden deterioration which is caused by a light absorption at the end surface portions of the semiconductor due to the shrinkage of the band gap thereof arising from the electric current flowing through the end mirror surfaces.

According to the present embodiment, since the active layer 105 is located near the heat sink, thermal properties of the device are excellent. Because of an effect of the electric current-confinement and an effect obtained by the fact that there was no light deterioration, this device had markedly improved characteristics, that is, the device operated as a laser at operating voltage 3.2V, electric current of 10 mA, and the maximum light output was 300 mW@700 mA. The width of the current-confinement portion of this laser was 5 μm. It is possible to increase the maximum output up to 1 W by increasing this width.

Further, because the ZnO layer is narrowed in a horizontal direction, the lateral mode can be controlled well and therefore, this structure could be used as a light source for the laser disk system. As in the previous embodiment, the end portions were cleaved off by applying supersonic waves after the device was etched, resulting that the light-emitting efficiency was further improved.

In the present embodiment, although the n-type substrate was used, it is also possible to form the device by using the p-type substrate and reversing the conductive type of the each layer of present embodiment. Nitrogen was used as impurities incorporated into the ZnO layer. When a p-side resistance is high, nitrogen is effective for the electric current-confinement.

What is claimed is:

1. A method for producing a nitride-based compound semiconductor light-emitting device having a single optical resonator and a cleaved surface from which a laser beam is emitted; comprising the steps of:

forming a first contact layer on a substrate;

forming an electric current-confinement layer, on said first contact layer;

forming an active layer comprising a compound including nitrogen, on said electric current-confinement layer;

forming a second contact layer, on said active layer;

etching said second contact layer, said active layer and said electric current-confinement layer using a mask until said first contact layer is exposed to a mesa-type laminated structure;

forming a first electrode which is in contact with said first contact layer;

forming a second electrode which is in contact with said second contact layer;

separating devices one by one by dicing;

placing said separated devices on a base, then dipping said separated devices into an etching solution to selectively etch said electric current-confinement layer from side surfaces of said mesa-type laminated structure, and forming a recess in said side surfaces parallel to said laser beam so as to confine an electric current to said optical resonator while forming a recess in the side surfaces perpendicular to said laser beam; and cleaving an upper end portion of said mesa-type laminated structure including said active layer projecting on said recess formed perpendicular to said laser beam by applying an external force to said mesa-type laminated structure on which said recess is formed so as to form said cleaved surface.

2. A method for producing a nitride-based compound semiconductor light-emitting device according to claim 1, further comprising a step between said placing step and said cleaving step of forming a protective coat around the mesa-type laminated structure except at an upper end portion of said mesa-type laminated structure projecting said recess.

3. A method for producing a nitride-based compound semiconductor light-emitting device according to claim 2, wherein said step of forming a protective coat is performed so as to passivate side surfaces of said current-confinement layer to prevent current leakage.

4. A method for producing a nitride-based compound semiconductor light-emitting device according to claim 3, wherein said etching mask includes at least a pair of wedge-like notches opposed to each other for concentrating stresses along a natural cleavage plane of said second nitride-based compound semiconductor so that said second nitride-based compound semiconductor which constitutes said active layer is cleaved along a line connecting bottoms of said notches.

5. A method for producing a nitride-based compound semiconductor light-emitting device according to claim 2, wherein said step of cleaving is performed so as to cleave said upper end portion at an edge of said protective coat.

6. A method for producing a nitride-based compound semiconductor light-emitting device according to claim 1, wherein said etching step is performed by using an etching mask including at least one wedge-like notch so as to concentrate stresses along a natural cleavage surface of said second nitride-based compound layer.

7. A method for producing a nitride-based compound semiconductor light-emitting device having a cleaved surface from which a laser beam is emitted; comprising the steps of:

forming laminated layers including an intermediate layer, a first cladding layer comprising a first nitride-based compound semiconductor an active layer comprising a second nitride-based compound semiconductor and a second cladding layer comprising a third nitride-based compound semiconductor, on a substrate;

forming an etching mask including at least one wedge-like notch for concentrating stresses along a natural cleavage plane of said second nitride-based compound semiconductor on said laminated layers;

conducting a first etching step for etching the laminated layers in a vertical direction with respect to said substrate through said etching mask until a side surface of said intermediate layer is exposed to form a mesa-type laminated structure;

conducting a second etching step for selectively etching said side surface of said intermediate layer which is exposed by said first etching step, thereby forming a recess; and removing, by cleavage at said wedge-like notch, an end portion of the mesa-type laminated structure including said active layer projecting on said recess so as to form said cleaved surface.

8. A method for producing a nitride-based compound semiconductor light-emitting device according to claim 7, wherein said etching mask includes at least a pair of wedge-like notches opposed to each other for concentrating stresses along a natural cleavage plane of said second nitride-based compound semiconductor so that said second nitride-based compound semiconductor which constitutes said active layer is cleaved along a line connecting bottoms of said notches.

9. A method for producing a nitride-based compound semiconductor light-emitting device having a single optical resonator which emits a laser beam; comprising the steps of:

forming an electric current-confinement layer on an upper surface of a substrate;

forming a first cladding layer comprising a first nitride-based compound semiconductor, on said electric current-confinement layer;

forming an active layer comprising a second nitride-based compound semiconductor, on said first cladding layer;

forming a second cladding layer comprising a third nitride-based compound semiconductor, on said active layer;

forming a first electrode on the laminated structure;

forming a second electrode on a lower surface of said substrate;

separating devices one by one to form a mesa-type laminated structure; and selectively etching said electric current-confinement layer which is exposed to side surfaces of said mesa-type laminated structure to form a recess in said side surfaces parallel to said laser beam to form a current-confinement structure in which, an electric current is confined by said current-confinement layer at the time of current application through the first electrode and the second electrode so that a current density at said resonator is increased.

10. A method for producing a nitride-based compound semiconductor light-emitting device according to claim 9, wherein said electric current-confinement layer comprises a material selected from the group consisting of AlN, AlGaN, InAlGaN, ZnO and InGaN.

11. A method for producing a nitride based compound semiconductor light-emitting device according to claim 10, wherein said substrate comprises SiC.

12. A method for producing a nitride-based compound semiconductor light-emitting device according to claim 9, further comprising a step after said selectively etching step of forming a protective coat around the mesa-type laminated structure so as to prevent current leakage flowing on a surface.

* * * * *